United States Patent
Keuper et al.

(10) Patent No.: US 7,408,201 B2
(45) Date of Patent: *Aug. 5, 2008

(54) POLARIZED SEMICONDUCTOR LIGHT EMITTING DEVICE

(75) Inventors: Matthijs H. Keuper, San Jose, CA (US); Michael R. Krames, Mountain View, CA (US); Gerd O. Mueller, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 61 days.

This patent is subject to a terminal disclaimer.

(21) Appl. No.: 10/804,314

(22) Filed: Mar. 19, 2004

(65) Prior Publication Data

US 2005/0224826 A1    Oct. 13, 2005

(51) Int. Cl.
G02F 1/133    (2006.01)
(52) U.S. Cl. .......................................... 257/98; 362/19
(58) Field of Classification Search ........... 257/98–100; 348/76, 87, 373; 353/119; 362/19, 555, 362/583
See application file for complete search history.

(56) References Cited

U.S. PATENT DOCUMENTS

| | | | |
|---|---|---|---|
| 3,599,109 A | 8/1971 | Guggenheim et al. | |
| 4,084,130 A * | 4/1978 | Holton | 372/50.1 |
| 4,240,692 A | 12/1980 | Winston | 350/96.1 |
| 4,289,381 A | 9/1981 | Garvin et al. | |
| 5,457,530 A | 10/1995 | Nagai | |
| 5,727,108 A | 3/1998 | Hed | 385/133 |
| 5,805,624 A | 9/1998 | Yang et al. | |
| 5,945,670 A * | 8/1999 | Rudeen | 250/235 |
| 5,955,749 A | 9/1999 | Joannopoulos et al. | |
| 6,072,197 A | 6/2000 | Horino et al. | |
| 6,122,103 A | 9/2000 | Perkins et al. | |
| 6,257,737 B1 | 7/2001 | Marshall et al. | 362/231 |
| 6,364,487 B1 * | 4/2002 | Weber et al. | 353/30 |
| 6,520,643 B1 | 2/2003 | Holman et al. | 353/20 |

(Continued)

FOREIGN PATENT DOCUMENTS

WO    WO 01/93387 A2    12/2001

OTHER PUBLICATIONS

H. De Neve et al., "Recycling of guided mode light emission in planar microcavity light emitting diodes", Appl., Phys. Lett. vol. 70, No. 7, (1997), pp. 799-801.

(Continued)

*Primary Examiner*—Thomas L Dickey

(57) ABSTRACT

A light emitting device includes a light emitting diode (LED), a concentrator element, such as a compound parabolic concentrator, and a wavelength converting material, such as a phosphor. The concentrator element receives light from the LED and emits the light from an exit surface, which is smaller than the entrance surface. The wavelength converting material is, e.g., disposed over the exit surface. The radiance of the light emitting diode is preserved or increased despite the isotropic re-emitted light by the wavelength converting material. In one embodiment, the polarized light from a polarized LED is provided to a polarized optical system, such as a microdisplay. In another embodiment, the orthogonally polarized light from two polarized LEDs is combined, e.g., via a polarizing beamsplitter, and is provided to non-polarized optical system, such as a microdisplay. If desired, a concentrator element may be disposed between the beamsplitter and the microdisplay.

37 Claims, 4 Drawing Sheets

U.S. PATENT DOCUMENTS

| | | | | |
|---|---|---|---|---|
| 6,603,243 | B2 | 8/2003 | Parkyn et al. | 313/113 |
| 6,670,647 | B1 | 12/2003 | Yamasaki et al. | |
| 6,739,723 | B1 | 5/2004 | Haven et al. | |
| 7,091,514 | B2 | 8/2006 | Craven et al. | |
| 2001/0026567 | A1 | 10/2001 | Kaneko et al. | |
| 2001/0036083 | A1* | 11/2001 | Weber et al. | 362/555 |
| 2002/0004307 | A1 | 1/2002 | Yamada | |
| 2002/0031153 | A1* | 3/2002 | Niwa et al. | 372/45 |
| 2002/0084467 | A1 | 7/2002 | Krames et al. | |
| 2002/0110172 | A1 | 8/2002 | Hasnain et al. | |
| 2002/0140880 | A1* | 10/2002 | Weindorf et al. | 349/70 |
| 2003/0067568 | A1 | 4/2003 | Hamamoto | |
| 2003/0214633 | A1* | 11/2003 | Roddy et al. | 353/31 |
| 2003/0235229 | A1 | 12/2003 | Deng et al. | |
| 2004/0120379 | A1 | 6/2004 | Kaneko et al. | |
| 2004/0189167 | A1 | 9/2004 | Adachi et al. | |

OTHER PUBLICATIONS

Yue Jun Sun et al., "Nonpolar $In_xGa_{1-x}N/GaN(1\bar{1}00)$ multiple quantum wells grown on $\gamma$-$LiAlO_2$ (100) by plasma-assisted molecular-beam epitaxy", Physical Review B 67, 041306(R), (2003), pp. 041306-1 to 041306-4.

Yue Jun Sun et al., "Polarization anisotropy of the photoluminescense of M-plane (In,Ga)N/GaN multiple quantum wells", Applied Physics Letters, vol. 82, No. 22, (Jun. 2, 2003), pp. 3850-3852.

Non-Final Office Action mailed on Aug. 25, 2005, for U.S. Appl. No. 10/805,424, eight pages.

Response to Non-Final Office Action mailed on Jan. 25, 2006, for U.S. Appl. No. 10/805,424, nine pages.

Final Office Action mailed on Apr. 14, 2006, , for U.S. Appl. No. 10/805,424, nine pages.

Response to Final Office Action mailed on Oct. 16, 2006, for U.S. Appl. No. 10/805,424, seven pages.

Non-Final Office Action mailed on Jan. 25, 2007, for U.S. Appl. No. 10/805,424, six pages.

Response to Non-Final Office Action mailed on Feb. 7, 2007, for U.S. Appl. No. 10/805,424, six pages.

Non-Final Office Action mailed on May 14, 2007, for U.S. Appl. No. 10/805,424, fourteen pages.

Response to Non-Final Office Action mailed on Sep. 14, 2007, for U.S. Appl. No. 10/805,424, fourteen pages.

Eurpean Search Report for App. No. 05101808.3, corresponding to U.S. Appl. No. 10/805,424, dated Sep. 21, 2005, six pages.

Mukaihara et al., "Polarization Control of Vertical-Cavity Surface-Emitting Lasers Using a Birefringent Metal/Dielectric Polarizer Loaded on Top Distributed Bragg Reflector," IEEE Journal of Selected Topics in Quantum Electronics, vol. 1, No. 2, Jun. 1995, pp. 667-673.

Nishiyama et al., "Single-Transverse mode and Stable-Polarization Operation Under High-Speed Modulation of InGaAs-GaAs Vertical-Cavity Surface-Emitting Laser Grown on GaAs (311) B Substrate", IEEE Photonics Technology Letters 10(12), 1676-1678 (Dec. 1998).

* cited by examiner

POLARIZED SEMICONDUCTOR LIGHT EMITTING DEVICE

FIELD OF THE INVENTION

The present invention relates generally to light emitting diodes and in particular to high-radiance optical systems that use light emitting diodes.

BACKGROUND

Certain optical systems, such as projection systems and automobile headlights, require light sources with high radiance or luminance. Until recently, the luminance of conventional light emitting diodes (LEDs) was inadequate to fulfill the needs for such applications. However, even with current high performance LEDs, the radiance requirement for some optical systems is difficult to fulfill. By way of example, optical systems that require polarized light and use conventional (randomly polarized) LEDs typically suffer a loss in radiance making such system unacceptable for high brightness applications. Additionally, systems that convert the wavelengths of light emitted from a high radiance LED, e.g., using a phosphor, lose radiance and are therefore similarly unacceptable for high brightness applications.

Thus, what is needed is an optical system that uses LEDs and that provides sufficient radiance to be used in high brightness applications.

SUMMARY

In accordance with an embodiment of the present invention, a system includes a light emitting diode having an epitaxial structure comprising an active region sandwiched between an n-type region and a p-type region, the active region configured to emit light that is at least 80% polarized along a first polarization orientation when forward biased. The system also includes a microdisplay that is disposed in the path of the light emitted by the active region of the first light emitting diode. In another aspect, the system may include an epitaxial structure comprising an active region sandwiched between an n-type region and a p-type region, the active region configured to emit light that is at least 80% polarized along a second polarization orientation when forward biased. In such an embodiment, the system further includes a polarizing beamsplitter that is disposed in the path of the light emitted by the first and second light emitting diodes. The polarizing beamsplitter combines the light from the two light emitting diodes and the microdisplay receives the combined light from the polarizing beamsplitter.

In accordance with another embodiment of the present invention, an apparatus includes an epitaxial structure comprising an active region sandwiched between an n-type region and a p-type region where the active region configured to emit light when forward biased. The apparatus further includes a non-absorbing polarizer, such as a wire grid polarizer, coupled to the active region. The non-absorbing polarizer transmits light having a desired polarization orientation and reflects light that does not have the desired polarization orientation. A randomizing element, such as a wavelength converting material, e.g., phosphor, or a roughened scattering surface, is coupled to the active region and the non-absorbing polarizer. The randomizing element is positioned to receive light emitted from the active region and the non-absorbing polarizer. The randomizing element at least partially randomizes the polarization state of the light.

In accordance with another embodiment of the present invention, an apparatus includes a light emitting diode and a transparent member having an entrance surface that is coupled to the light emitting diode. The transparent member has reflective surfaces that define an exit surface through which light exits the transparent member. The exit surface is smaller than the entrance surface. The transparent member is shaped such that light emitted from the light emitting diode is directed toward the exit surface. The apparatus also includes a wavelength converting material that is coupled to the transparent member. In one embodiment, the reflective surfaces are formed from a reflective material that overlies the transparent member, and in another embodiment, the reflective surfaces are formed from the sidewalls of the transparent member itself.

In yet another embodiment of the present invention, a light emitting device includes a light emitting diode and a concentrator element coupled to the light emitting diode. The concentrator element having an entrance surface coupled to receive light emitted by the light emitting diode, and an exit surface that is smaller than the entrance surface. The concentrator element being shaped such that light received at the entrance surface is directed toward the exit surface. The light emitting device includes a wavelength converting material disposed over the exit surface.

DETAILED DESCRIPTION

In accordance with an embodiment of the present invention, an optical system uses light emitting diodes (LEDs) in high brightness applications. By way of example, the optical systems may use high radiance LEDs and/or LEDs that emit polarized light.

Figure 1:
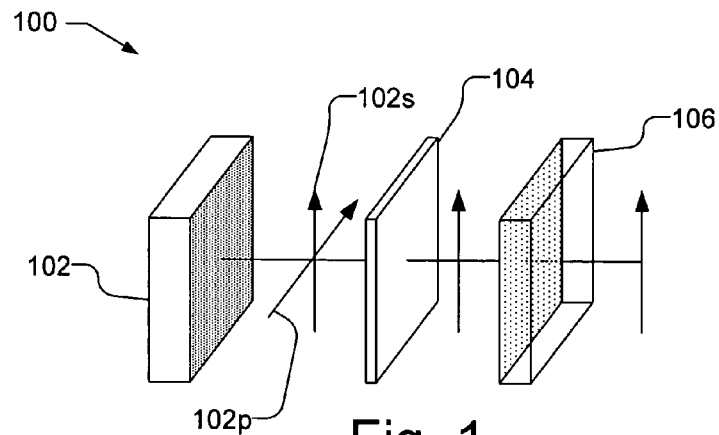
FIG. 1 illustrates a conventional projection system that includes an LED that emits unpolarized light.

FIG. 1 illustrates a conventional projection system 100 that includes an LED 102 that emits unpolarized light, as indicated by arrows 102s and 102p. System 100 uses a microdisplay 106 that requires polarized light and, thus, system 100 includes a polarizing filter 104 that filters the light emitted by LED 102. Because the polarizing filter 104 filters all s polarized light and passes only p polarized light, only 50 percent of the light emitted by LED 102 is received by the microdisplay 106. Thus, conventional projection system 100 loses approximately one half of its luminance.

Figure 2A:
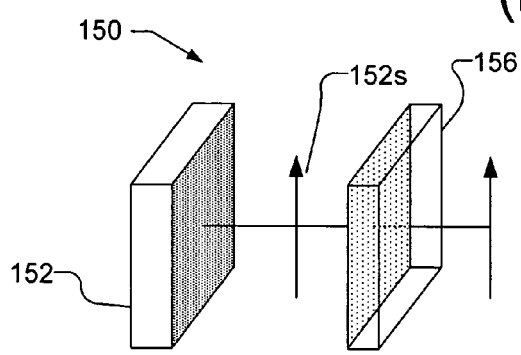
FIG. 2A illustrates a projection system that includes an LED that emits polarized light.

FIG. 2A illustrates a projection system 150 that includes an LED 152 that emits polarized light, illustrated as arrow 152s, and a microdisplay 156 that is disposed in the path of the light emitted by LED 152. The microdisplay 156 uses polarized light, and is thus, sometimes referred to herein as a polarized microdisplay.

Figure 2B:
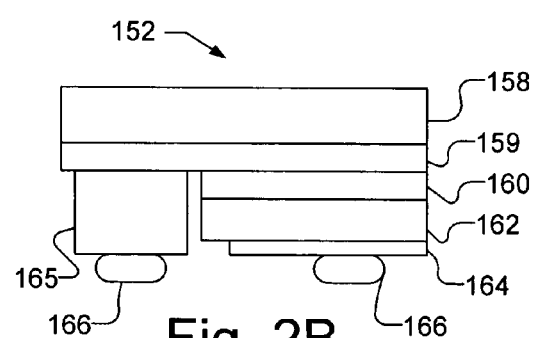
FIGS. 2B and 2C illustrate cross-sectional views of LEDs that emits polarized light.

FIG. 2B illustrates a cross sectional view of the polarized LED 152, in accordance with one embodiment. LED 152 is illustrated with a flip-chip design. LED 152 is a III-nitride light emitting diode, with an n-type III-nitride layer 159 formed on a substrate 158, which may be, e.g., sapphire, SiC, GaN, or any other suitable substrate. A light emitting region 160, also sometimes referred to as the active region 160, is formed on n-type layer 159, and a p-type layer 162 is formed on the active region 160. FIG. 2B also illustrates a first contact 165 with interconnect 166, which are coupled to layer 159 and a second contact 164 with interconnect 166, which are coupled to layer 162. At least one of contacts 164 and 165 may be reflective which increases light output. Interconnects 36 may be, for example, solder bumps or gold bumps.

In one embodiment, the LED 152 is a III-nitride light emitting device that is grown such that the crystallographic (0001) direction, also known as the c-axis, is parallel to the plane of the light emitting III-nitride layers. Light emitted by such devices may be at least partially linearly polarized. A device or crystal layer with the <0001> directions parallel to the plane of the layer or layers is referred to below as an "in-plane" device or layer, since the c-axis is parallel to or in the plane of the device layers. In some embodiments, the light emitting layer or layers in the active region of a III-nitride device are <10$\bar{1}$0> or <11$\bar{2}$0> layers of the quaternary alloy In$_x$Al$_y$Ga$_{1-x-y}$N (0≦x≦1, 0≦y≦1, x+y≦1).

Devices with in-plane light emitting layers may be fabricated by growing the device layers on an in-plane growth substrate. Examples of substrates suitable for growth of an in-plane active region include the {10$\bar{1}$0} and {11$\bar{2}$0} surfaces of SiC of the 2H, 4H, or 6H polytypes; {10$\bar{1}$2} surfaces of sapphire; and {100} surfaces of γ-LiAlO$_2$. In the case of SiC substrates, the orientation of the deposited III-nitride films matches the orientation of the substrate. When using the metal-organic chemical vapor-phase epitaxy technique, the process of depositing the in-plane III-nitride layers is similar to the process used for depositing <0001> III-nitride layers on a <0001> SiC substrate. A buffer layer of AlGaN is deposited, at high temperature (~1100° C.), directly on the SiC substrate. A layer of GaN is deposited on the AlGaN buffer layer. Light-emitting AlInGaN quantum wells are deposited on the GaN layer.

In the case of a sapphire substrate with a {10$\bar{1}$2} surface, the deposited III-nitride films are oriented in the <11$\bar{2}$0> direction. When using the metal-organic chemical vapor-phase epitaxy technique, the process of depositing in-plane III-nitride layers is similar to the process used for depositing <0001> III-nitride layers on a <0001> sapphire substrate. A III-nitride buffer layer is deposited, at low temperature (~550° C.), directly on the sapphire substrate. A layer of GaN is deposited on the III-nitride buffer layer. Light emitting AlInGaN quantum wells are deposited on the GaN layer.

In the case of a <100> γ-LiAlO$_2$ substrate, the deposited III-nitride films are oriented in the <10$\bar{1}$0> direction. The process for depositing in-plane III-nitride layers by molecular beam epitaxy consists of depositing a III-nitride buffer layer at low temperature (~550° C.) directly on the substrate, followed by a layer of GaN grown at a higher temperature. The light-emitting AlInGaN quantum wells are deposited on the GaN layer.

The inventors prepared III-nitride photoluminescence test structures grown on {10$\bar{1}$0} SiC and {10$\bar{1}$2} sapphire. When the test structures were excited by a 396 nm laser to emit light at 475 nm, the light from the {10$\bar{1}$0} SiC device was greater than about 90% polarized, and the light from the {10$\bar{1}$2} sapphire device was about 80% polarized. When the test structures were electrically excited, the light from the {10$\bar{1}$0} SiC device was 70-80% polarized. Percent polarization is defined as:

$$\frac{|I_p - I_s|}{I_p + I_s} \times 100\% \qquad \text{eq. 1}$$

where $I_p$ and $I_s$ are the intensities of vertically and horizontally polarized light. Embodiments of the present invention may include devices that emit light that is at least 50% polarized.

Additional information and uses of an in-plane polarized LED are discussed in U.S. patent application Ser. No. 10/805,424, entitled "Semiconductor Light Emitting Devices Including In-Plane Light Emitting Layers" by James C. Kim, Jonathan J. Wierer, Jr., Nathan F. Gardner, John E. Epler, and Michael R. Krames, concurrently filed herewith and having the same assignee as the present disclosure, and which is incorporated herein by reference.

Figure 2C:
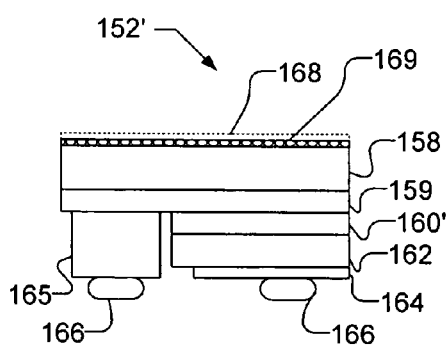

FIG. 2C illustrates a cross sectional view of a polarized LED 152', in accordance with another embodiment of the present invention. LED 152' is similar to LED 152, shown in FIG. 2B, like designated elements being the same. LED 152', however, may be standard LED, i.e., LED 152' is need not be in-plane polarized and, thus, the active region 160' of LED 152' may be conventionally formed. As illustrated in FIG. 2C, the LED 152' may include a non-absorbing polarizer, such as a wire grid polarizer 168. A randomizing element 169, which may be, e.g., a wavelength converting material, such as a phosphor layer, may be disposed between the wire grid polarizer 168 and the active region 160'. Thus, the polarization of light emitted by the active region 160' is randomized prior to the wire grid polarizer 168, e.g., by the phosphor layer absorbing and reemitting the light. The wire grid polarizer 168 transmits the light with the desired polarization and reflects the remaining light back to the randomizing layer 169. The reflected light is absorbed by the phosphor layer and the polarization state of the reflected light is again randomized when the light is reemitted. The wire grid polarizer 168 then transmits the light with the desired polarization state and reflects the remaining light. Thus, with the use of the randomizing element 169 and non-absorbing polarizer 168, light emitted externally from the device is greater than 50% polarized.

In another embodiment, the randomizing element 169 in LED 152' is a roughened scattering surface of the substrate 158, which alters the polarization state of light that is transmitted and/or reflected. Roughening a surface of the substrate 158 (or any other surface in the LED 152') may be performed using well-known processing methods, such as wet chemical etching, dry chemical and related techniques. Where the randomizing element 169 is a roughened surface of the substrate 158, it is desirable to separate the non-absorbing polarizer 168 and the roughened surface of the substrate 158, e.g., with a transparent layer or other appropriate spacer. With the use of a roughened surface of the substrate 158, the polarization state of the light that reflected by the wire grid polarizer 168 will be randomized as the light passes through the roughened surface. The light is then reflected internally within LED 152' and reemitted through the roughened surface, which further randomizes the polarization state of the light. The wire grid polarizer will then transmit the light with the desired polarization state and reflects the remaining light. If desired, the roughened surface need not be the top layer of the substrate 158, but may be located in other layers of the LED 152'. Further, if desired the randomizing element 169 may be formed from other appropriate material or layers, such as birefringent materials. If desired, more than one randomizing element 169 may be used with LED 152'. For example, LED 152' may include both a wavelength converting layer and a roughened surface and/or a birefringent material.

Referring back to FIG. 2A, the microdisplay 156 in projection system 150 may be manufactured by Seiko-Epson, as part number L3D07H. In general, the LED 152 produces polarized light and thus eliminates the need for the polarizer 104 in FIG. 1. The LED 152 has approximately the same flux as the unpolarized LED 102, shown in FIG. 1. Accordingly, essentially all of the light emitted by LED 152 can be used to illuminate the microdisplay 156. Therefore, the projection system 150 is approximately twice as bright as the projection system 100 as the total flux received by the microdisplay 156 is approximately twice that received by microdisplay 106.

It should be understood that projection system 150 may include additional optical elements, such as lenses, prisms and/or lightguides, which are well known and commonly used in projection system. The present disclosure illustrates primarily elements that are related to polarization, i.e., are polarization sensitive or modify the polarization state, for the sake of simplicity and so as to not unduly obscure the present invention.

Figure 3:
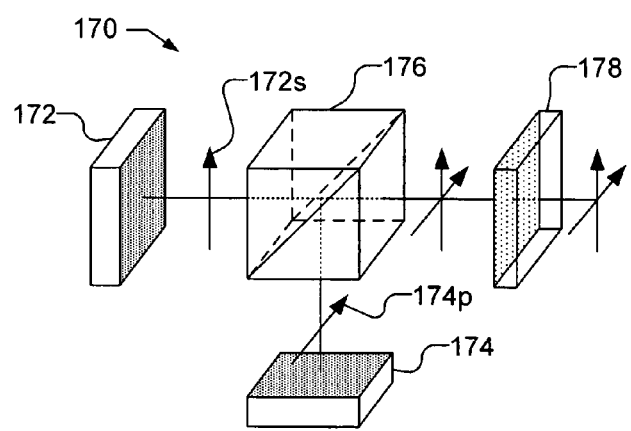
FIG. 3 illustrates a projection system, in accordance with an embodiment of the present invention, which uses two polarized LEDs, a polarizing beamsplitter and a non-polarized microdisplay.

The use of a polarized LED 152 is further advantageous in projection systems that use non-polarized microdisplays, i.e., microdisplays that not require the use of polarized light. FIG. 3 illustrates a projection system 170, in accordance with another embodiment of the present invention, that uses two polarized LEDs 172 and 174, a polarizing beamsplitter 176 and a non-polarized microdisplay 178. The microdisplay 178 may be manufactured by Texas Instruments, part no. 0.7XGA DDR, which is a reflective display and, thus, element 178 shown in FIG. 3 would include a microdisplay and prisms. As illustrated in FIG. 3, LED 172 produces light 172s that is orthogonally polarized with respect to the light 174p that is emitted by LED 174. The LEDs 172 and 174 may be similar to the LED discussed in reference to FIG. 2A, 2B, and 2C.

The LEDs 172 and 174 are positioned relative to polarizing beamsplitter 176 so that the light emitted from LED 172 is passed by polarizing beamsplitter 176 and the light emitted from LED 174 is reflected by polarizing beamsplitter 176 to combine the emitted light from the two LEDs 172 and 174. If desired, the LEDs 172 and 174 may be mounted directly to the polarizing beamsplitter 176 or positioned near the beam splitter 176 with additional optical elements, such as lenses, collimators, and/or mirrors, (not shown) disposed between the LED 172, 174 and the beamsplitter 176.

The microdisplay 178, which does not require polarized light, receives the light combined by polarizing beamsplitter 176. The flux received by the microdisplay 178 is approximately twice the flux received in a conventional system with a single non-polarized LED emitting light that is received by a non-polarized microdisplay. Accordingly, the projection system 170, with the use of two polarized LEDs produces an effective luminance that is approximately twice that found in conventional systems.

In another embodiment of the present invention, one or more high radiance LEDs are used in an optical system that converts the wavelengths of the light emitted from the LEDs without losing significant radiance in the system. In general, radiance can be described by the following:

$$\text{Radiance} = \frac{P}{\alpha * SA} \qquad \text{eq. 2}$$

where P is the emitted power, $\alpha$ is the solid angle of the emitted radiation, and SA is the surface area of emission.

Typically, LEDs emit radiation over a wide angle, i.e., the solid angle $\alpha$ is large. To increase the radiance of an LED, which is useful for high brightness applications, the solid angle $\alpha$ of emitted radiation is typically decreased resulting in an LED that emits radiation in a narrow cone. For example, the solid angle a of emission can be decreased using photonic crystals or a DBR (Distributed Bragg Reflector). Photonic crystals are described in, e.g., U.S. patent application Ser. No. 10/804,810, entitled "Photonic Crystal Light Emitting Device, by Jonathan J. Wierer, Jr., Michael R. Krames and John E. Epler, concurrently filed herewith, and having the same assignee as the present disclosure and which is incorporated herein by reference. Further a resonant cavity LED, which is a one-dimensional photonic crystal device, is described in H. De. Neve et al., "Recycling of guided mode light emission in planar microcavity light emitting diodes", Appl. Phys. Lett. 70(7), 1997, pp. 799-801, which is incorporated herein by reference.

Figure 4:
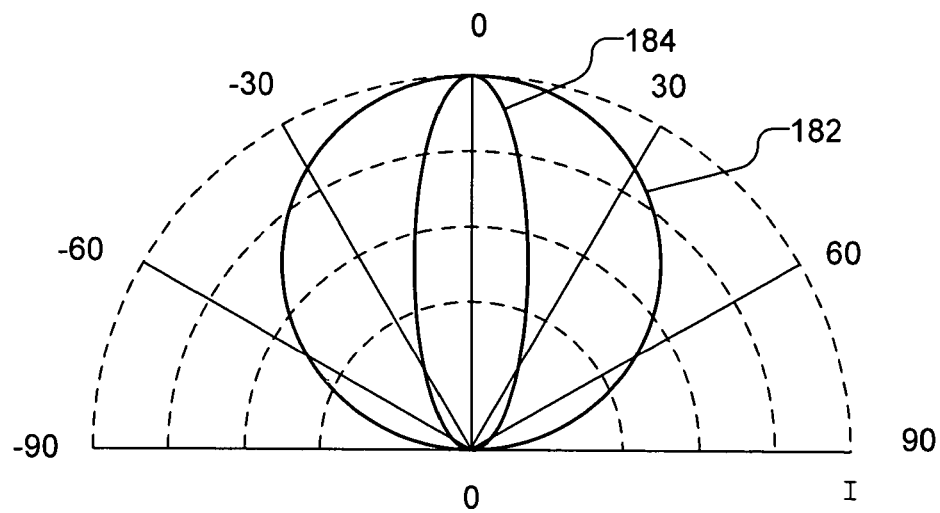
FIG. 4 illustrates a plot of typical radiation patterns, where the radiant intensity I is plotted as a function of angle from normal to the LED emitting surface.

FIG. 4 illustrates a plot of typical radiation patterns, where the radiant intensity I is plotted as a function of angle from normal to the LED emitting surface. Two radiation patterns are shown plotted in FIG. 4: a Lambertian radiation pattern 182, which is a typical (idealized) pattern for normal LEDs, and a narrow radiation pattern 184, which is generated by a high radiance LED.

Figure 5A:
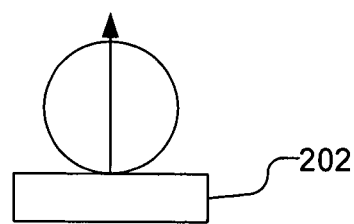
FIG. 5A and FIG. 5B illustrate a conventional LED and the conventional LED covered with a phosphor layer, respectively.
Figure 6A:
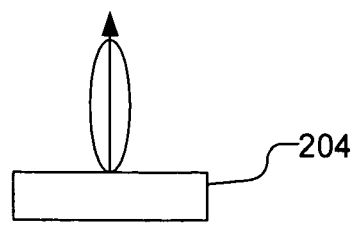
FIG. 6A and FIG. 6B illustrate a high radiance LED and the high radiance LED covered with a phosphor layer, respectively.

FIG. 5A and FIG. 6A illustrate a conventional LED 202 and a high radiance LED 204. For illustrative purposes, LED 202 is shown producing a Lambertian radiation pattern, while high radiance LED 204 is shown producing a narrow radiation pattern in FIGS. 5A and 6A, respectively.

Sometimes it is desirable to convert the wavelength of light emitted from an LED to another wavelength, e.g., using a fluorescent material such as phosphor. For example, if the LED produces blue light, a Ce-doped Yttrium Aluminum Garnet (YAG) phosphor material may be used to absorb the blue emission and emit yellow light. The yellow light from phosphor may mix with blue light emitted from the LED and that is transmitted through the phosphor to produce a white light. If desired, other materials may be used to produce green or red light. The phosphor is typically applied as a thin coating covering the complete emission surface of the LED.

Figure 5B:
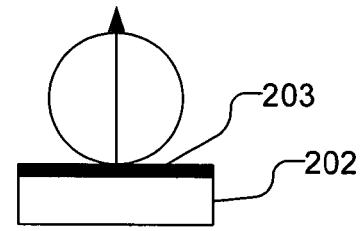
Figure 6B:
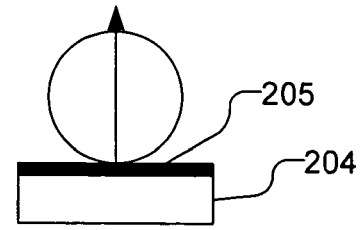

FIGS. 5B and 6B illustrate a phosphor layer 203 and 205 conventionally deposited on the conventional LED 202 and high radiance LED 204, respectively. A property of a phosphor layer is that it absorbs and then reemits light, i.e., the emitted radiation pattern of a phosphor is independent of the radiation pattern of the source used to illuminate the phosphor. As illustrated in FIGS. 5B and 6B, both the conventional LED 202 and the high radiance LED 204 result in a Lambertian radiation pattern after conversion. Thus, as can be seen, when a phosphor is used with a high radiance LED, the radiation emitted by the phosphor is the same as that produced by phosphor used with a conventional LED. Thus, the radiance advantage of the high radiance LED is lost when phosphor is used in a conventional manner.

In accordance with an embodiment of the present invention, an optical system that uses a wavelength converting element, such as a phosphor material, can maintain or even increase radiance by reducing the effective surface area of light emission, i.e., by reducing SA in equation 2. In one embodiment, a concentrator element, such as a compound parabolic concentrator (CPC) or similar structure is used with an LED to focus the area of light emission of the LED. Compound parabolic concentrators are well understood in the art and are generally formed from rotational symmetric parabolic shapes.

Figure 7:
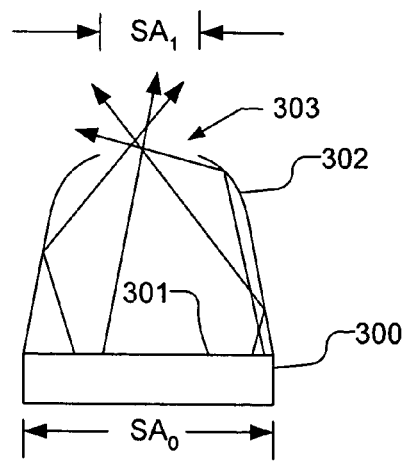
FIG. 7 illustrates an example of a high radiance LED with a concentrator element.

FIG. 7 illustrates an example of a high-radiance LED 300 (i.e., the solid angle a of emission is less than $\pi$) with a concentrator element 302. The LED 300 may be, e.g., a high-radiance LED such as that described in, e.g., U.S. patent application Ser. No. 10/804,810, entitled "Photonic Crystal Light Emitting Device, by Jonathan J. Wierer, Jr., Michael R. Krames and John E. Epler, having the same assignee as the present disclosure, which is incorporated herein by reference.

The concentrator element 302 may be formed by producing an optically transparent material with the desired shape. By way of example, the concentrator element 302 may be sapphire, glass, acrylic, silicone, epoxy, or any other suitable material capable of maintaining transparency when exposed to the light and heat emitted by the LED 300 and is bonded to the LED 300. The outer surface of the concentrator element 302 is covered with a reflective layer that surrounds an aperture that defines an exit area 303. In one embodiment, the reflective layer may be, for example, a metal having a reflectivity greater than 90%. Examples of suitable metals are as silver, aluminum, rhodium, and gold. The reflective metal may be selected based on the material on which it is to be deposited, or the wavelength of the light it is to reflect. For example, gold is highly reflective of light in the red or infrared wavelength ranges. In addition, a dielectric layer, such as a suitably low index of refraction material, may be positioned between the reflective layer and the concentrator element 302 in order to reduce optical loss.

In another embodiment, the concentrator element 302 is formed without the use of a reflective material overlying the surfaces of the transparent material. For example, the sidewalls of the transparent material may serve as the reflective surfaces of the concentrator element 302 when there is total internal reflection. The use of a transparent member with total internal reflection is described in U.S. Pat. No. 4,240,692 to Winston, dated. Dec. 23, 1980, which is incorporated herein by reference.

In another embodiment, the concentrator element 302 is formed of a hollow shell, e.g., a cavity within a solid body. The interior surfaces of the shell may be coated with a reflective material in some embodiments. By way of example, the concentrator element 302 may be manufactured by injection molding or compression molding of glass, plastic or metal, and the inside surfaces are covered with a suitably reflective material. In this embodiment, the LED 300 emits light into air (or a gas) that is within the concentrator element 302.

As illustrated in FIG. 7, high-radiance LED 300 has a surface 301 with an area $SA_0$ from which light is emitted. The concentrator element 302 is mounted to the LED 300 such that the light emitted from LED 300 is reflected within the concentrator element 302 and emitted through the exit 303 with a larger solid angle than the light emitted from the LED 300. As can be seen in FIG. 7, however, the concentrator element has a smaller area of emission $SA_1$. Consequently, the overall radiance of the system is preserved with the use of concentrator element 302, i.e., the solid angle α is increased but the surface area SA is reduced in equation 2.

Figure 8:
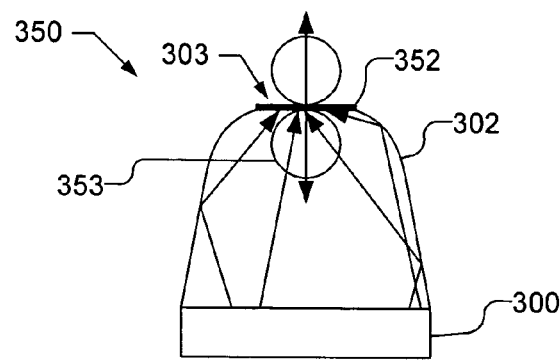
FIG. 8 illustrates a device that includes a high radiance LED, a concentrator element and a wavelength converting material, in accordance with an embodiment of the present invention.

FIG. 8 illustrates a device 350 that includes a high radiance LED 300 and concentrator element 302, as shown in FIG. 7, and further includes a phosphor layer 352 at the exit 303 of the concentrator element 302. Suitable phosphors may include, but are not limited to: Y3Al5O12:Ce, (Y,Gd)3(Al,Ga)5O12:Ce, (Lu,Y)3Al5O12:Ce, SrS:Eu, SrGa2S4:Eu, (Sr,Ca,Ba)(Al,Ga)2S4:Eu,(Ca,Sr)S:Eu, (Ca,Sr)S:Eu,Mn, (Ca,Sr)S:Ce, (Sr,Ba,Ca)2Si5N8:Eu, (Ba,Sr,Ca)2SiO4:Eu, and (Ca,Sr,Ba)Si2O2N2:Eu. Typically, such phosphors are obtained in powder form and may be deposited on the transparent medium of the concentrator element 302 by incorporating in a binding medium such as silicone or epoxy and then applying by methods such as screen-printing or dispensing, before curing to set the binder. Alternatively, the phosphor grains can be deposited first, e.g., by electrophoresis, then back infused with the selected binder, and then cured. It may be advantageous to deposit the phosphor on a separate member before attaching it to the transparent medium of the concentrator element 302. The phosphors may also be employed in solid form, e.g., thin film phosphor, without a binder. The solid phosphor layer may be deposited on a separate member (e.g., thin film) or may be handled separately and attached directly to the transparent medium of the concentrator element 302 in the case of a thick solid phosphor film. In the embodiment in which the concentrator element 302 is a hollow shell, the phosphor may be deposited on a medium, such as glass or plastic that is then mounted over the exit 303 of the concentrator element 302. In addition to phosphors, other luminescent materials may be used in accordance with an embodiment of the present invention, such as organic luminescent converters, and semiconductor layers and/or semiconductor nano-particles, sometimes referred to as "quantum dots".

In general, the phosphor layer 352 is able to absorb light at all angles. The phosphor layer 352 emits light with a wide solid angle, as illustrated with the Lambertian radiation pattern, but because of the reduced surface area SA, of emission the radiance of the system is preserved. Except for wavelength conversion losses, the device 350 has approximately one half of the radiance as high radiance LED 300 without the phosphor layer 352 or concentrator element 302.

It should be understood that approximately 50 percent of the light emitted by the phosphor layer 352 will be directed back to the LED 300 as illustrated in FIG. 8 by the Lambertian radiation pattern 353. In general, the LED 300 is reflective and this light will be recycled. However, in accordance with another embodiment of the present invention, a filter may be used to prevent the backward emission of the light by the phosphor layer 352 toward the LED 300. By way of example, a dichroic filter may be combined with the phosphor layer 352, i.e., on the same member that the phosphor is deposited, before attachment to the concentrator element 302.

Figure 9A:
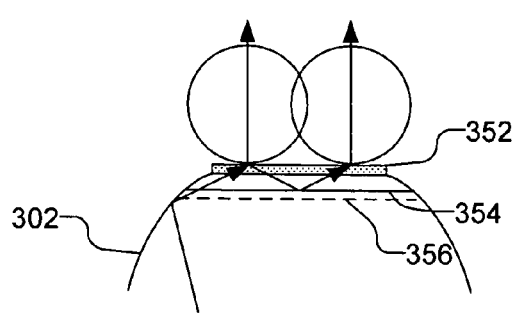
FIGS. 9A and 9B illustrate enlarged views of the exit area of the concentrator element and wavelength converting layer with filters, such as a dichroic filter placed below and above the phosphor layer, respectively.

FIG. 9A illustrates an enlarged view of the exit area of the concentrator element 302 and phosphor layer 352 with a filter 354, such as a dichroic filter. The filter 354 may be located between the phosphor layer 352 and the LED (not shown in FIG. 9A), e.g., by depositing the filter 354 over the exit area 303 of the concentrator element and then depositing the phosphor layer 352 over the filter 354. Because the light emitted by the phosphor layer 352 and the LED 300 have different wavelengths, the filter 354 can be chosen to transmit the light emitted by the LED 300 and reflect the light emitted by the phosphor layer 352. Thus, any light emitted by the phosphor layer 352 in the direction of the LED 300 will be reflected by the filter 354 and redirected back to the phosphor layer 352 as illustrated in FIG. 9A.

In addition, if LED 300 is a polarized LED 300, a polarizer 356, such as a wire-grid polarizer, a dual brightness enhancement film (DBEF) polarizer or other polarizing element, illustrated in FIG. 9A with broken lines, can be used in place of or in addition to the filter 354. Polarizer 356 is configured to transmit the polarized radiation emitted from the LED 300. The radiation emitted from the phosphor layer 352 is unpolarized, and thus, will be partially reflected back into the phosphor layer 352. The use of a polarized LED 300 and polarizer 356 has the additional benefit of increasing the conversion efficiency of the phosphor layer 352. The wire grid polarizer 356, which can be purchased from Moxtek, Inc., can be mounted, e.g., on the filter 354 or added as a separate element.

Figure 9B:
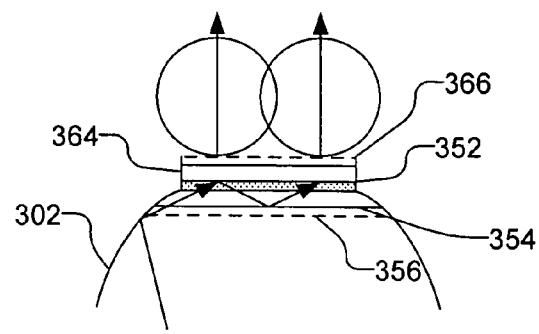

FIG. 9B is similar to FIG. 9A and illustrates an enlarged view of the exit area of the concentrator element 302 and phosphor layer 352 with a filter 354. As illustrated in FIG. 9B, however, a filter 364, e.g., a dichroic filter, may be located over the phosphor layer 352, such that the phosphor layer 352 is disposed between the filter 364 and the LED 300 (not shown in FIG. 9B). The filter 364 is chosen to transmit light that is emitted by phosphor layer 352 and to reflect light emitted by the LED 300. Thus, any light from the LED 300 that passes through phosphor layer 352 without conversion is reflected back to the phosphor layer 352. In addition, as illustrated in FIG. 9B, a polarizer 366, such as a wire-grid polarizer, a DBEF polarizer or other non-absorbing polarizer, may also be located over the phosphor layer 352. In some embodiments, the exit area of the concentrator element 302 may include only phosphor 352, filter 364, and in some embodiments, and polarizer 366, without the underlying filter 354 and polarizer 356.

One prominent application of an LED with phosphor layer 352 and the polarizer 366 is the supply of polarized radiation, e.g. to LCD light valves. Using wavelength converting phosphors advantageously provides an efficient randomization of light properties in the emission range of the phosphor. It has been experimentally proven that powder phosphor materials completely randomized the polarization of incident light in backscattering. Therefore using non-absorbing polarizers, such as wire-grid polarizers or DBEF sheet polarizers over the wavelength converting phosphor layer 364 leads to an increase in the flux of polarized light through the respective polarizer, e.g., from up to 60% to 100%.

It should be understood that while a compound parabolic concentrator is the most efficient structure to preserve radiance while reducing the surface area of emission, other simpler geometries may be used to concentrate the light. Concentrators with a simplified geometry will advantageously simplify manufacturing and reduce costs, but will have a small efficiency penalty.

Figure 10A:
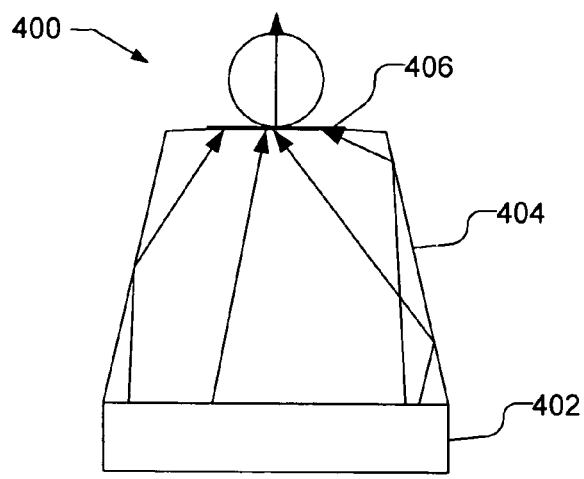
FIGS. 10A and 10B illustrate two different possible shapes of the concentrator structure that may be used in accordance with an embodiment of the present invention.
Figure 10B:
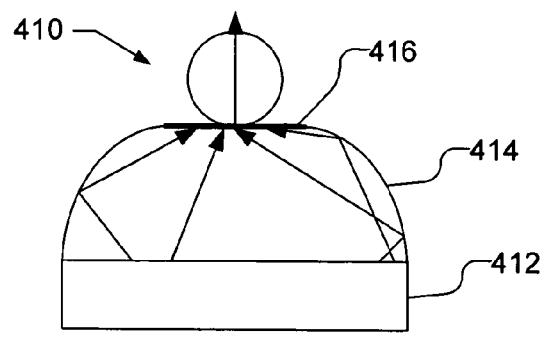

FIGS. 10A and 10B illustrate two different possible shapes of the concentrator structure that may be used in accordance with an embodiment of the present invention. FIG. 10A illustrates a device 400 with a high radiance LED 402, a concentrator element 404 having approximately straight walls, and a phosphor layer 406 over the exit of the concentrator element 404. FIG. 10B illustrates a device 410 with a high radiance LED 412, a concentrator element 414 having curved walls, and a phosphor layer 416 over the exit of the concentrator element 414. Both device 400 and 410 emit light over a wide angle from the phosphor layers 406 and 416, respectively, which is over the exit area of the concentrator elements 404 and 414, respectively. The surface area of the phosphor layers 406 and 416 is reduced relative to the surface area of the light source, i.e., LEDs 402 and 412, respectively, and thus, the radiance of devices 400 and 402 is approximately preserved despite the increase in the solid angle of light emission.

Figure 11:
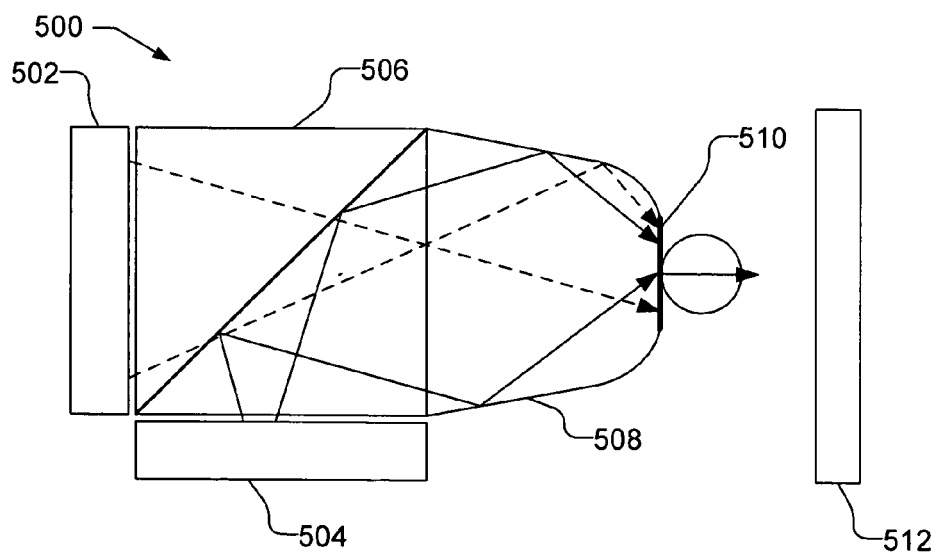
FIG. 11 illustrates a device that has two high radiance polarized LEDs that are combined to illuminate a wavelength converting material.

In another embodiment of the present invention, two polarized high radiance LEDs may be used in conjunction to produce a high luminance light source that uses a phosphor layer. FIG. 11 illustrates a device 500 that has two high radiance polarized LEDs 502 and 504 that are combined to illuminate a phosphor layer 510. The device 500 further includes a polarizing beamsplitter 506 and a concentrator element 508, such as a compound parabolic concentrator (CPC). The polarization of LED 502 is orthogonal to the polarization of the other LED 504. As shown in FIG. 11, the polarizing beamsplitter 506 is configured to pass the radiation emitted from LED 502, which is illustrated with broken lines, and to reflect the radiation from LED 504, which is illustrated with solid lines. Thus, polarizing beamsplitter 506 combines the emitted radiation from the two LEDs 502 and 504.

The concentrator element 508 focuses the combined light from beamsplitter 506 into a small exit area, which is covered with the phosphor layer 510. If desired, a filter and/or polarizer element may be disposed below and/or over the phosphor layer 510 as discussed above. The phosphor layer 510 emits light over a wide angle, as illustrated by the Lambertian radiation pattern in FIG. 11. As discussed above, because the concentrator element 508 reduces the surface area of emission, the radiance of the device 500 is not significantly decreased despite the increase in the solid angle a of emission caused by the phosphor layer 510. The radiation emitted from the phosphor layer 510 can then be received, e.g., by a microdisplay 512. If desired, a filter and/or a polarizer may be used with device 500 as described above.

Although the present invention is illustrated in connection with specific embodiments for instructional purposes, the present invention is not limited thereto. Various adaptations and modifications may be made without departing from the scope of the invention. Further, it should be understood that the term "coupled" is used herein to mean either a direct connection between the items connected, or an indirect connection through one or more passive or active intermediary devices, whereas the term "connected" is used herein to mean a direct connection between the items connected, without any intermediate devices. Therefore, the spirit and scope of the appended claims should not be limited to the foregoing description.

What is claimed is:

1. A system comprising:
    a first light emitting diode that is non-lasing and having an epitaxial structure comprising an active region sandwiched between an n-type region and a p-type region, the active region configured to emit light that is at least 50% polarized along a first polarization orientation when forward biased wherein percent polarization is defined as:

$$\frac{|I_p - I_s|}{I_p + I_s} \times 100\%$$

where $I_p$ and $I_s$ are the intensities of vertically and horizontally polarized light;

a microdisplay disposed in a path of light emitted by the active region from the first light emitting device;

a second light emitting diode that is non-lasing and having an epitaxial structure comprising an active region sandwiched between an n-type region and a p-type region, the active region of the second light emitting diode configured to emit light that is at least 50% polarized along a second polarization orientation when forward biased;

a polarizing beamsplitter disposed in the path of the light having a first polarization orientation emitted by the first light emitting diode and light having a second polarization orientation emitted by the second light emitting diode, wherein the polarizing beamsplitter combines the light having a first polarization orientation and the light having a second polarization orientation; and wherein the microdisplay receives the light having a first polarization orientation and the light having a second polarization orientation after being combined by the polarizing beamsplitter.

2. The system of claim 1, wherein the first polarization orientation is orthogonal to the second polarization orientation.

3. The system of claim 1, wherein the polarizing beamsplitter has a first entrance surface, a second entrance surface and an exit surface, the first light emitting diode being coupled to the first entrance surface and the second light emitting diode being coupled to the second entrance surface, the system further comprising:

a concentrator member having an entrance surface coupled to the exit surface of the polarizing beamsplitter, the concentrator member having an exit surface that has a smaller area than the entrance surface of the concentrator member, wherein light from the beamsplitter enters the concentrator member through the entrance surface and is emitted from the exit surface of the concentrator member; and a wavelength converting element coupled to the concentrator member.

4. The system of claim 3, wherein more than half of the light that enters the concentrator member through the entrance surface is emitted through the exit surface of the concentrator element.

5. The system of claim 3, wherein the concentrator member is a compound parabolic concentrator.

6. The system of claim 3, wherein the concentrator member comprises a transparent element coupled to the polarizing beamsplitter, the transparent member having reflective surfaces that define the exit surface.

7. The system of claim 6, wherein the reflective surfaces are formed from a reflective material overlying a portion of the transparent member.

8. The system of claim 6, wherein the reflective surfaces are formed from sidewalls of the transparent member.

9. The system of claim 3, wherein the concentrator member is formed from a cavity within a solid body.

10. The system of claim 3, wherein the wavelength converting element is disposed on the exit surface of the concentrator element.

11. The system of claim 3, wherein the wavelength converting element is a phosphor layer.

12. The system of claim 3, further comprising a polarizing element disposed on the wavelength converting element, wherein the wavelength converting element is disposed between the polarizing element and the polarizing beamsplitter.

13. An apparatus comprising:

an epitaxial structure comprising an active region having upper and lower surfaces sandwiched between an n-type region and a p-type region, the active region configured to emit light when forward biased;

a non-absorbing polarizer having a surface that receives light, the surface of the non-absorbing polarizer being substantially parallel to the upper and lower surfaces of the active region, the non-absorbing polarizer transmitting light having a desired polarization orientation and reflecting light that does not have the desired polarization orientation; and a means for randomizing coupled to the active region and the non-absorbing polarizer, the means for randomizing positioned to receive light emitted from the active region before the light is received by the non-absorbing polarizer and to receive light reflected from the non-absorbing polarizer, the means for randomizing at least partially randomizes the polarization state of the light.

14. The apparatus of claim 13, wherein the non-absorbing polarizer is a wire grid polarizer.

15. The apparatus of claim 13, wherein the means for randomizing is a wavelength converting material disposed between the non-absorbing polarizer and the active region.

16. The apparatus of claim 15, wherein the wavelength converting material is a phosphor.

17. The apparatus of claim 13, further comprising:

a transparent member having an entrance surface coupled to the active region to receive light emitted by the active region, the transparent member having reflective surfaces that define an exit surface through which light exits the transparent member, wherein the transparent member is shaped such that light emitted from the active region is directed toward the exit surface;

wherein the non-absorbing polarizer is coupled to the transparent member and is positioned over the exit surface and the randomizing element is disposed between the non-absorbing polarizer and the active region.

18. The apparatus of claim 17, wherein the transparent member forms a compound parabolic concentrator.

19. The apparatus of claim 17, wherein the reflective surfaces are formed from a reflective material overlying a portion of the transparent member.

20. The apparatus of claim 19, further comprising a dielectric layer disposed between the transparent member and reflective material.

21. The apparatus of claim 17, wherein the reflective surfaces are formed from sidewalls of the transparent member.

22. The apparatus of claim 17, further comprising a dichroic filter disposed between the randomizing element and the non-absorbing polarizer.

23. The apparatus of claim 17, further comprising a second non-absorbing polarizer, the second non-absorbing polarizer being disposed between the randomizing element and the active region.

24. The apparatus of claim 13, further comprising a microdisplay disposed in a path of light transmitted by the non-absorbing polarizer.

25. The apparatus of claim 24, wherein the microdisplay is a polarized microdisplay.

26. The apparatus of claim 24, further comprising:
a second epitaxial structure comprising a second active region sandwiched between a second n-type region and a second p-type region, the second active region configured to emit light when forward biased;
a second non-absorbing polarizer coupled to the second active region, the second non-absorbing polarizer transmitting light having a second polarization orientation that is orthogonal to the polarization orientation of the light transmitted by the non-absorbing polarizer, and reflecting light that does not have the second polarization orientation;
a second randomizing element coupled to the second active region and the second non-absorbing polarizer, the second randomizing element positioned to receive light emitted from the second active region and the second non-absorbing polarizer, the second randomizing element at least partially randomizes the polarization state of the light; and
a polarizing beamsplitter disposed in the path of the light transmitted by the non absorbing polarizer and the light transmitted by the second non absorbing polarizer, wherein the polarizing beamsplitter combines the light transmitted by the non absorbing polarizer and the light transmitted by the second non absorbing polarizer;
wherein the microdisplay receives the combined light from the polarizing beamsplitter.

27. The apparatus of claim 24, wherein the active region is a first active region in a first light emitting diode, the apparatus further comprising:
a second light emitting diode having a second epitaxial structure comprising a second active region sandwiched between a second n-type region and a second p-type region, the second active region configured to emit light when forward biased;
a polarizing beamsplitter has a first entrance surface, a second entrance surface and an exit surface, the first light emitting diode being coupled to the first entrance surface and the second light emitting diode being coupled to the second entrance surface, wherein the polarizing beamsplitter combines the light emitted by the first light emitting diode and the light emitted by the second light emitting diode;
a concentrator member having an entrance surface coupled to the exit surface of the polarizing beamsplitter, the concentrator member having an exit surface that has a smaller area than the entrance surface of the concentrator member, wherein light from the beamsplitter enters the concentrator member through the entrance surface and is emitted from the exit surface of the concentrator member;
wherein the non-absorbing polarizer is coupled to the concentrator member and is positioned over the exit surface and the randomizing element is disposed between the non-absorbing polarizer and the concentrator member.

28. An apparatus comprising:
a light emitting diode that emits light from a light emitting surface;
a non-absorbing polarizer having a surface that receives light, the surface of the non-absorbing polarizer being substantially parallel to the light emitting surface of the light emitting diode, the non-absorbing polarizer transmitting light having a desired polarization orientation and reflecting light that does not have the desired polarization orientation;
a randomizing element coupled to the light emitting diode and the non-absorbing polarizer, the randomizing element positioned to receive light emitted from light emitting diode and reflected from the non-absorbing polarizer, the randomizing element at least partially randomizes the polarization state of the light; and
a microdisplay disposed in a path of light transmitted by the non-absorbing polarizer.

29. The apparatus of claim 28, wherein the microdisplay is a polarized microdisplay.

30. The apparatus of claim 28, wherein the non-absorbing polarizer is a wire grid polarizer.

31. The apparatus of claim 28, wherein the randomizing element is a wavelength converting material disposed between the non-absorbing polarizer and the light emitting diode.

32. The apparatus of claim 28, wherein the light emitting diode is a first light emitting diode, the apparatus further comprising:
a second light emitting diode that emits light;
a polarizing beamsplitter disposed in the path of the light emitted by the first light emitting diode and the light emitted by the second light emitting diode, wherein the polarizing beamsplitter combines the light emitted by the first light emitting diode and the light emitted by the second light emitting diode;
wherein the microdisplay receives the combined light from the polarizing beamsplitter.

33. The apparatus of claim 32, further comprising:
a second non-absorbing polarizer coupled to the second light emitting diode, the second non-absorbing polarizer transmitting light having a second polarization orientation that is orthogonal to the polarization orientation of the light transmitted by the non-absorbing polarizer that is coupled to the first light emitting diode, and reflecting light that does not have the second polarization orientation;
a second randomizing element coupled to the second light emitting diode and the second non-absorbing polarizer, the second randomizing element positioned to receive light emitted from the second light emitting diode and the second non-absorbing polarizer, the second randomizing element at least partially randomizes the polarization state of the light.

34. The apparatus of claim 32, wherein the polarizing beamsplitter has a first entrance surface, a second entrance surface and an exit surface, the first light emitting diode being coupled to the first entrance surface and the second light emitting diode being coupled to the second entrance surface, the apparatus further comprising:
an optical element having an entrance surface coupled to the exit surface of the polarizing beamsplitter, the optical element having an exit surface, wherein light from the beamsplitter enters the optical element through the entrance surface and is emitted from the exit surface of the optical element;
wherein the non-absorbing polarizer is coupled to the optical element and is positioned over the exit surface and the randomizing element is disposed between the non-absorbing polarizer and the optical element.

35. The apparatus of claim 28, further comprising:
an optical element having an entrance surface coupled to the light emitting diode and an exit surface through which light exits the optical element, wherein the concentrator member is shaped such that light emitted from the active region is directed toward the exit surface;
wherein the non-absorbing polarizer is coupled to the optical element and is positioned over the exit surface and the randomizing element is disposed between the non-absorbing polarizer and the light emitting diode.

36. An apparatus comprising:

an epitaxial structure comprising an active region sandwiched between an n-type region and a p-type region, the active region configured to emit light when forward biased;

a non-absorbing polarizer coupled to the active region, the non-absorbing polarizer transmitting light having a desired polarization orientation and reflecting light that does not have the desired polarization orientation; and a randomizing element coupled to the active region and the non-absorbing polarizer, the randomizing element positioned to receive light emitted from the active region and reflected from the non-absorbing polarizer, the randomizing element at least partially randomizes the polarization state of the light, wherein the randomizing element is a roughened surface that scatters light;

wherein the apparatus is a light emitting diode that further comprises a substrate, wherein a surface of the substrate is the roughened surface that is disposed between the non-absorbing polarizer and the active region.

37. An apparatus comprising:

an epitaxial structure comprising an active region sandwiched between an n-type region and a p-type region, the active region configured to emit light when forward biased;

a non-absorbing polarizer coupled to the active region, the non-absorbing polarizer transmitting light having a desired polarization orientation and reflecting light that does not have the desired polarization orientation; and a randomizing element coupled to the active region and the non-absorbing polarizer, the randomizing element positioned to receive light emitted from the active region and reflected from the non-absorbing polarizer, the randomizing element at least partially randomizes the polarization state of the light, wherein the randomizing element is a birefringent material.

* * * * *